United States Patent [19]
Gill et al.

[11] Patent Number: 5,371,031
[45] Date of Patent: Dec. 6, 1994

[54] METHOD OF MAKING EEPROM ARRAY WITH BURIED N+ WINDOWS AND WITH SEPARATE ERASING AND PROGRAMMING REGIONS

[75] Inventors: Manzur Gill, Arcola; Inn K. Lee, Houston, both of Tex.

[73] Assignee: Texas Instruments Incorporated, Dallas, Tex.

[21] Appl. No.: 89,206

[22] Filed: Jul. 9, 1993

Related U.S. Application Data

[60] Division of Ser. No. 895,144, Jun. 5, 1992, abandoned, which is a continuation of Ser. No. 723,738, Jun. 20, 1991, abandoned, which is a continuation of Ser. No. 561,028, Aug. 1, 1990, abandoned.

[51] Int. Cl.$^5$ .................................. H01L 21/70
[52] U.S. Cl. ........................ 437/52; 437/43; 437/48
[58] Field of Search ..................... 437/43, 48, 52; 257/315, 317, 321

[56] References Cited

U.S. PATENT DOCUMENTS

| | | | |
|---|---|---|---|
| 4,451,904 | 5/1984 | Sugiura et al. | 365/185 |
| 4,668,970 | 5/1987 | Yatsuda et al. | 365/185 |
| 4,698,787 | 10/1987 | Mukherjee et al. | 365/185 |
| 5,008,721 | 4/1991 | Gill et al. | 365/185 |
| 5,019,527 | 5/1991 | Ohshima | 437/43 |
| 5,081,056 | 1/1992 | Mazzali et al. | 437/43 |
| 5,215,934 | 6/1993 | Tzeng | 437/43 |

Primary Examiner—Tom Thomas
Attorney, Agent, or Firm—Theodore D. Lindgren; Leo N. Heiting; Richard L. Donaldson

[57] ABSTRACT

An electrically-erasable, electrically-programmable, read-only-memory cell array is formed in pairs at a face of a semiconductor substrate (22). Each memory cell includes a source region (11) and a drain region (12), with a corresponding channel region between. A Fowler-Nordheim tunnel-window (13a) is located over the source line (17) connected to source (11). The source line (17) consists of alternating buried N+ windows (17a) and source regions (11). A floating gate (13) includes a tunnel-window section. A control gate (14) is disposed over the floating gate (13), insulated by an intervening inter-level dielectric (27). The floating gate (13) and the control gate (14) include a channel section (Ch). The channel section (Ch) is used as a self-alignment implant mask for the source (11) and drain (12) regions, such that the channel-junction edges are aligned with the corresponding edges of the channel section (Ch). The memory cell is programmed by hot-carrier injection from the channel to the floating gate (13), and erased by Fowler-Nordheim tunneling from the floating gate (13) through the tunnel window (13a) to the source-line (17). The program and erase regions of the cells are physically separate from each other, and the characteristics, including the oxides, of each of those regions may be made optimum independently from each other.

10 Claims, 9 Drawing Sheets

METHOD OF MAKING EEPROM ARRAY WITH BURIED N+ WINDOWS AND WITH SEPARATE ERASING AND PROGRAMMING REGIONS

This is a division of application Ser. No. 07/895,144, filed Jun. 5, 1992 now abandoned, which is a continuation of abandoned application Ser. No. 07/723,738, filed Jun. 20, 1991 which is a continuation of abandoned application Ser. No. 07/561,028 filed on Aug. 1, 1990.

RELATED APPLICATIONS

This application discloses subject matter also disclosed in U.S. patent application Ser. No. 07/637,390, now abandoned; U.S. Pat. No. 5,012,307 issued Apr. 30, 1991; U.S. Pat. No. 5,017,980 issued May 21, 1991; U.S. Pat. No. 5,008,721 issued Apr. 16, 1991; U.S. Pat. No. 5,168,335 issued Dec. 1, 1992; U.S. Pat. No. 4,994,403 issued Feb. 19, 1991; U.S. Pat. No. 5,010,028 issued Apr. 23, 1991; U.S. patent application Ser. No. 08/057,406, filed May 6, 1993 now abandoned; U.S. patent application Ser. No. 08/082,659 filed Jun. 25, 1993; U.S. patent application Ser. No. 08/083,113 filed Jun. 25, 1993; and U.S. patent application Ser. No. 08/083,834 filed Jun. 25, 1993; all assigned to Texas Instruments Incorporated, the assignee of this invention. The aforegoing applications are incorporated herein by reference.

BACKGROUND OF THE INVENTION

The present invention relates to a nonvolatile, integrated-circuit memory such as an electrically-erasable, electrically-programmable read-only-memory (EEPROM), and more particularly to an EEPROM array with memory cells that are programmed by hot-carrier injection in a region associated with each cell and that are erased by Fowler-Nordheim tunneling in another region associated with each cell, and to a method of fabricating such a device.

EEPROMs using field-effect transistors with floating-gate structures are programmed and erased by electrically storing and removing charges from the dielectric-insulated floating gates. The digital information stored in EEPROMs is read by differentiating between the source-drain impedance presented by a charged (high voltage threshold Vt) floating gate and an uncharged (low Vt) floating gate. Depending on construction, EEPROMs may be erased cell-by-cell, segment-by-segment, all cells at one time (flash-erase mode), or combinations of the foregoing.

In general, EEPROMs use one of two charge-transfer mechanisms for programming operations—either Fowler-Nordheim tunneling or hot-carrier injection. Fowler-Nordheim tunneling is generally used for erase operations. EEPROMs using hot-carrier injection programming typically employ FAMOS (Floating-gate, Avalanche-injection MOS) structures, although hot-carrier injection results from channel-hot electrons as well as avalanche breakdown (assuming NMOS).

Each of the two charge-transfer mechanisms has advantages and disadvantages in comparison to the other mechanism. Programming an EEPROM memory cell by hot-carrier injection requires lower voltage than the voltage required for Fowler-Nordheim tunneling. On the other hand, the higher voltage required for Fowler-Nordheim tunneling can be generated on-chip because of the relatively small tunneling-current required. In many cases, an additional power supply is required to meet the higher programming-current requirement for hot-carrier injection. Moreover, floating-gate erasure using hot-carrier injection of holes may cause damage to the oxide insulator layer, leading to cell degradation and failure. Use of Fowler-Nordheim tunneling for erasing causes significantly less damage to the tunnel-window oxide and is, therefore, preferable for cell durability and reliability.

EEPROMs using hot-carrier injection for programming and using Fowler-Nordheim tunneling for erasure have been described in: (a) "Electrically Alterable 8192 Bit N-Channel MOS PROM", R. Muller et al., ISSCC 1977 (p. 188–189); (b) "A Single Transistor EEPROM cell and its implementation in a 512K CMOS EEPROM", S. Mukherjee et al., IEDM 1985 (p. 616–619); (c) "An In-System Reprogrammable 256K CMOS Flash Memory", V. N. Kynett et al., ISSCC 1988 (p. 132–133); (d) "A 128K Flash EEPROM using double polysilicon Technology", G. Samachisa et al., ISSCC 1987 (p. 87–88); (e) "Reliability Performance of ETOX Based Flash Memories", G. Verma et al., IEEE/IRPS 1988 (p. 158–166); and (f) "A 90 ns 100K Erase/Program Cycle Megabit Flash Memory", V. Kynett et al., ISSCC 1989 (p. 140–141). References (b) and ((d) are also discussed in U.S. Pat. No. 4,698,787 and No. 4,639,893, respectively. References (c), (e) and (f) relate to the same cell structure. The foregoing publications include discussions of gate oxide thickness in relation to the trade-off between adequate tunneling current for erase in a reasonable time, and the impact on yields/reliability from processing defects. That is, thick gate oxide improves process yields/reliability, but reduces tunnel current, which leads to long erase times. Moreover, the junction breakdown voltage is lowered with thin gate oxide, so that, during erase, excessive junction leakage (and the unwanted generation of hot carriers) can occur before the onset of adequate Fowler-Nordheim tunnel erase current. See, e.g., references (c), (d) and (e). Thus, these EEPROMs are erased, in part, by hot holes because of low field plate breakdown voltage of the source-channel junction of the floating-gate transistor.

The approach in reference (d) uses a channel oxide of about 200 Angstroms, and uses channel-hot-electron injection for programming, and Fowler-Nordheim tunneling for erasure from the same junction. It has two disadvantages: (i) the junction optimization requirements for erasing/programming are incompatible, and cannot be met by the same junction; and (ii) a gate oxide thickness of 200 Angstroms does not allow adequate Fowler-Nordheim tunneling current for reasonable erase times with conventional 12.5V EEPROM power Supplies. On the other hand, junction-breakdown-assisted erase can occur, leading to excessive substrate current during erase.

The EEPROMs discussed in the foregoing references have not combined hot-carrier injection programming with strictly Fowler-Nordheim tunnel erasing. Using the structures described in the foregoing articles, the higher voltages required by Fowler-Nordheim tunnel erasing lead to source-channel junction field-plate breakdown, and the unwanted generation of hot carriers. U.S. patent applications Ser. No. 07/458,936 and Ser. No. 07/507,823 disclose memory cell configurations for buried-bitline-type of EEPROMs that are programmed by hot-carrier injection and that are erased by Fowler-Nordheim tunnelling. Those structures require formation of three layers of polysilicon, have buried source and drain lines, and have source/drain junctions formed by a N+ Self-Aligned Gate (NSAG) process.

Referenced U.S. patent application Ser. No. 08/082,659 also discloses a memory that is programmed by hot-carrier injection and that is erased by Fowler-Nordheim tunnelling. The cell area of the structure of that invention is characterized by a continuous buried N+ source line connected to each cell. The cell width of the structure of that invention is defined by cell-isolation thick-field insulator regions.

U.S. Pat. No. 4,422,092, issued on Dec. 20, 1983 to Daniel C. Guterman and assigned to Texas Instruments Incorporated, uses buried N+ source and drain lines to improve capacitive coupling between control gate and floating gate because of the overlap of those gates on the cell-isolation thick-field insulator regions.

U.S. patent applications Ser. No. 07/269,836; Ser. No. 07/269,837; Ser. No. 07/269,838; Ser. No. 07/269,849; and Ser. No. 07/270,594; all of which are also assigned to Texas Instruments Incorporated, utilize a three-polisilicon-layer structure with a wordline segment separate from the control gate.

SUMMARY OF THE INVENTION

The structure and method of this invention provide an alternative to the structures and methods of the aforementioned U.S. patent applications Ser. No. 07/458,936 and Ser. No. 07/507,823 in two respects: (i) The structure and method of this invention require formation of only two layers of polysilicon, rather than the three layers required for the structures disclosed in those Applications; and (ii) the structure of this invention requires one-half of a contact per bit, whereas in those Applications both source and drain lines are buried in a manner which requires no contact in the immediate vicinity of each bit. From another viewpoint, this invention discloses an improvement over the structures generally described in references (b), (c), (d), (e), and (f) above. The improvement greatly decreases the unwanted generation of hot carriers during Fowler-Nordheim erasing operations and decreases the possibility of disturbing non-selected cells during programming operations. The structure of this invention allows an oxide thickness in the tunnel region of about 100 Angstroms, while allowing the channel oxide to have a greater thickness ranging from perhaps 100 to 400 Angstroms.

The present invention provides increased durability of an EEPROM cell by using hot-carrier injection for programming and by using Fowler-Nordheim tunneling for erasing. The efficiency of injection programming is made optimum by a suitably profiled channel with an abrupt drain-channel junction, while substrate leakage and hot-carrier-injection erasure is suppressed by a tunnel-window configuration that increases the source-junction field-plate breakdown voltage. Moreover, the programming junction structure and the erase junction structure, being physically separate, may be made optimum independently.

A floating-gate conductor is disposed over and insulated from the channel region for controlling the channel conductivity. A control-gate conductor is disposed over and insulated from the floating gate. The floating-gate and control-gate conductors each include a channel section of a predetermined length, which is used during fabrication to align the source/drain junctions. The channel sections permit the source/drain implants to be self-aligned, provides effective control of channel length, and facilitates junction profiling (such as by doping optimization and/or subsequent controlled heat treatment cycles) to create abrupt drain-channel junctions, thereby increasing the efficiency of hot-carrier injection for programming. A tunnel-window section of the floating gate overlies a Fowler-Nordheim tunnel between the floating gate and the source line, the tunnel being separated from the channel region by distance along the junction of a cell-isolation thick-field insulator and a source-line thick insulator.

Compared to the structure of related U.S. Application Ser. No. 08/082,659, the structure of this invention has a smaller cell size because the buried N+ regions or windows (under the source-line thick insulators) are discontinuous, alternating with NSAG source diffusions to form source lines connecting the cells to external circuitry from the array. The structures of related U.S. Applications Ser. No. 08/082,659 and Ser. No. 08/083,113 require that the edge of the stack be a sufficient distance from the buried N+ source line to allow formation of a N+ source-channel junction that is aligned to that stack edge. This requirement has been removed by the structure of this invention. In addition, the cell width of the structure of this invention is in part defined by cell-isolation thick-field insulator spacing and in part defined by the source-line thick insulator spacing.

Source-line thick-insulator regions are formed over buried conductive regions (buried N+ windows) that alternate between source region formed by a NSAG process, the combination forming source lines. Each memory cell has a tunnel window formed between a source-line thick insulator and a cell-isolation thick-oxide insulator. A tunnel-window implant is used to profile a tunnel-window subregion of the source line. The tunnel-window insulator is substantially thinner than the gate insulator over the channel region (about 100 Angstroms compared to about 200–400 Angstroms).

The floating gates of the memory cells of the array are formed from a first-level conductive polysilicon layer, the first-level layer being formed over a channel-oxide layer, then patterned and etched to define parallel floating-gate strips. A second-level conductive polysilicon layer is formed over the substrate, insulated from the parallel floating-gate strips by an inter-level insulator layer.

A stack-etch procedure is used to define wordlines and floating gates for each row of memory cells. Each wordline includes control-gate conductors, which are capacitively coupled (through the inter-level insulator) to the floating gates of each memory cell in that wordline row. Each floating-gate conductor extends across most of a memory cell, maximizing capacitive coupling to the overlying control-gate conductor. The channel-section of each floating gate and control gate is used as self-aligned implant mask for implanting in a first conductivity-type substrate a source region of and a drain region of a second conductivity-type on either side. Junction profile implants may be used to create an abrupt drain-channel junction (made optimum for programming operations) and a sloped (graded) source-channel junction (made optimum for erasing operations).

During cell programming, appropriate programming voltages applied to the selected control-gate wordline and drain bitline to create a high-current condition in the selected channel region, injecting channel-hot electrons and/or avalanche-breakdown electrons across the channel oxide to the floating gate. During cell erasing, appropriate erasing voltages applied to the control-gates/wordlines and the source lines allow a Fowler-Nordheim tunnel current across the tunnel-window insulator to remove a selected charge from the floating gate, without causing hot-carrier erasure from source-junction field-plate breakdown.

The technical advantages of the injection-program/-tunnel-erase EEPROM cell of this invention include the following: (1) The memory cell uses hot-carrier injection for programming, allowing lower programming voltages than those required for Fowler-Nordheim tunneling. (2) It uses Fowler-Nordheim tunneling for erasing, avoiding damage to the channel oxide from hot-carrier erasure. (3) It is formed using two polysilicon layers in a fabrication technique that allows self-alignment of the source/drain junctions, and that allows the channel and the channel junctions to be profiled for optimum injection efficiency. (4) The capacitive coupling between a control-gate wordline and the floating-gate is maximized by overlap of the oxide covering the source line. (5) The memory cell is fabricated with a tunnel window located away from the boundary between the source and channel, thereby enhancing the field-plate breakdown voltage for the source-channel junction and inhibiting hot carrier injection during erasing because the junction under the tunnel window terminates under a relatively thick oxide. (6) The source-channel junction, the drain-channel junction, and the tunnel region can be made optimum separately for programming and erasing. (7) Since programming can be done adjacent to relatively thicker gate oxide, deprogramming due to bitline stress can be avoided.

As to advantage No. (7), in FAMOS-based EEPROM devices, the drain and gate of the selected cell is high during programming, while the gate is low and the drain is high for a deselected cell sharing the column with a cell or cells being programmed. As a result, the deselected, preprogrammed cell sharing the column with a cell being programmed experiences an electric field across the channel oxide, which may cause charge loss. This tendency of a deselected preprogrammed cell sharing the column with a cell being programmed to lose charge is called bitline stress. The bitline stress becomes worse as the channel oxide becomes thinner.

BRIEF DESCRIPTION OF THE DRAWINGS

The novel features of this invention are set forth in the appended claims. The invention, its features, and its advantages are described below in conjunction with the following drawings:

FIGS. 2a–d illustrate final fabrication steps not included in FIGS. 3a–f.

DETAILED DESCRIPTION OF THE INVENTION

Figure 1:
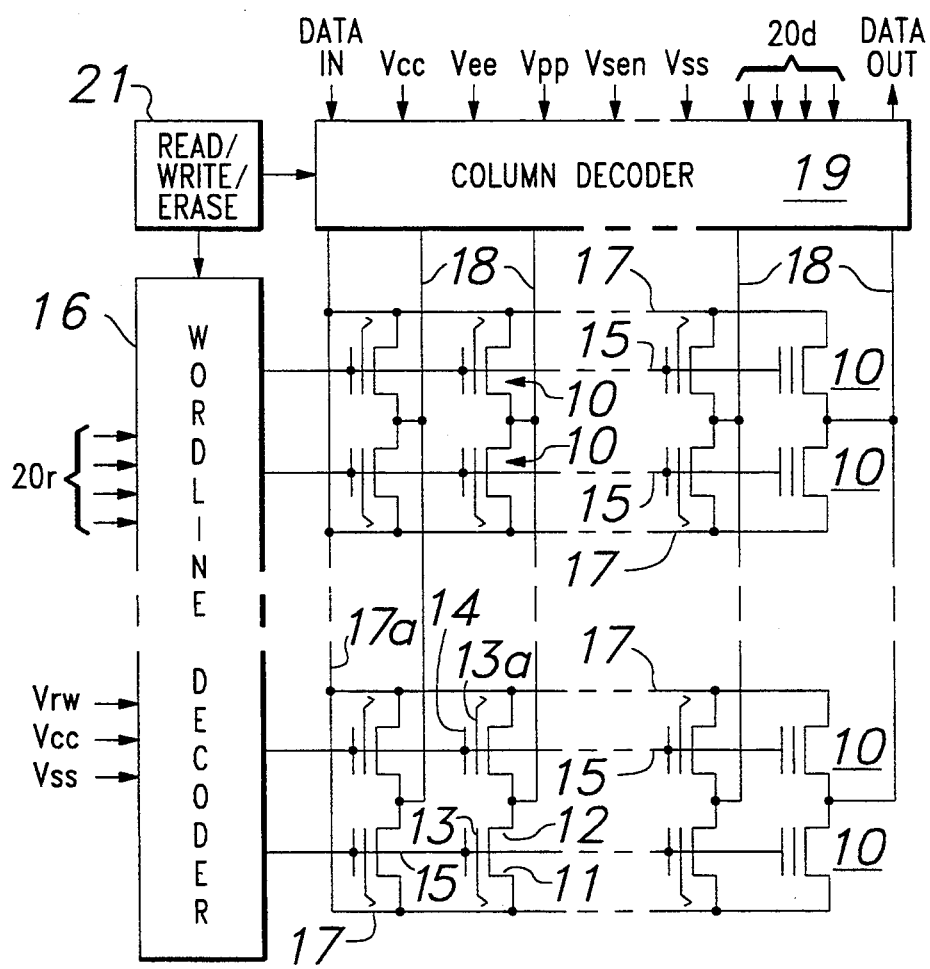
FIG. 1 is an electrical schematic diagram, in partial block form, of a memory cell array.

Referring to FIG. 1, an example array of memory cells, which is an integral part of a memory chip, is shown for the purpose of illustrating use of the circuit of this invention. Each cell is a floating-gate transistor 10 having a source 11, a drain 12, a floating gate 13 and a control gate 14. Each floating gate 13 has a Fowler-Nordheim tunneling window 13a that is disposed a distance from the source 11. Each of the control gates 14 in a row of cells 10 is connected to a wordline 15, and each of the wordlines 15 is connected to a wordline decoder 16. Each of the source electrodes 11 in a row of cells 10 is connected to a source line 17. Each of the drain electrodes 12 in a column of cells 10 is connected to a drain-column line 18. Each of the source lines 17 is connected by a column line 17a to a column decoder 19 and each of the drain-column lines 18 is connected to the column decoder 19.

In a write or program mode, the wordline decoder 16 may function, in response to wordline address signals on lines 20r and to signals from Read/Write/Erase control circuit 21, (or microprocessor 21) to place a preselected first programming voltage Vrw (approx. +10V) on a selected wordline 15, including a selected control-gate conductor 14. Column decoder 19 also functions to place a second programming voltage Vpp (approx. +5 to +10V) on a selected drain-column line 18 and, therefore, the drain region 12 of selected cell 10. Source lines 17 are connected to reference potential Vss. All of the deselected drain-column lines 18 are connected to reference potential Vss. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2V to −6V with respect to the channel region. For memory cells 10 fabricated in accordance with the preferred embodiment, the coupling coefficient between a control gate 14/wordline 15 and a floating gate 13 is approximately 0.5 to 0.65. Therefore, a programming voltage Vrw of 10 volts, for example, on a selected wordline 15, including the selected control gate 14, places a voltage of approximately 5 to +6.5V on the selected floating gate 13. The voltage difference between the floating gate 13 (at approx. +5 to +6.5V) and the grounded (approximately 0V) source line 17 is insufficient to cause a Fowler-Nordheim tunneling current across region 13a to charge the floating gate 13 of a selected or deselected cell 10. The floating gate 13 of the selected cell 10 is charged with electrons during programming, and the electrons in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

In a flash erase mode, the column decoder 19 may function to leave all drain-column lines 18 floating. The wordline decoder 16 functions to connect all the wordlines 15 to reference potential Vss. The column decoder 19 also functions to apply a high positive voltage Vee (approx. +10V to +15V) to all the source lines 17. These erasing voltages create sufficient field strength across the tunneling region 13a to generate a Fowler-Nordheim tunnel current that transfers charge from the floating gate 13, erasing the memory cell 10. Since the potential on the wordline 15 is 0V, the cell 10 remains in the nonconducting state during erase, and therefore, no channel-hot carriers are generated. The field-plate breakdown voltage of the source line junction has been made high enough to inhibit hot-carrier injection. The high field-plate breakdown voltage of the tunnel junctions is achieved by terminating the junction under a relatively thick oxide.

In the read mode, the wordline decoder 16 functions, in response to wordline address signals on lines 20r and to signals from Read/Write/Erase control circuit 21, to apply a preselected positive voltage Vcc (approx. +5V) to the selected wordline 15, and to apply a low voltage (ground or Vss) to deselected wordlines 15. The column decoder 19 functions to apply a preselected positive voltage Vsen (approx. +1.5V) to at least the selected drain-column line 18 and to apply a low voltage (0V) to the source line 17. The column decoder 19 also functions, in response to signal on address lines 20d, to connect the selected drain-column line 18 of the selected cell 10 to the DATA OUT terminal. The conductive or nonconductive state of the cell 10 connected to the selected drain-column line 18 and the selected wordline 15 is detected by a sense amplifier (not shown) connected to the DATA OUT terminal. The read voltages applied to the memory array are sufficient to determine channel impedance for a selected cell 10 but are insufficient to create either hot-carrier injection or Fowler-Nordheim tunneling that would disturb the charge condition of any floating gate 13.

For convenience, a table of read, write and erase voltages is given in TABLE I below:

TABLE I

|  | Read | Write | Flash Erase |
| --- | --- | --- | --- |
| Selected Wordline | 5V | 10V | 0V (All) |
| Deselected Wordlines | 0V | 0V | — |
| Selected Drain Line | 1.5V | 5–10V | Float (All) |
| Deselected Drain Lines | Float | 0V | — |
| Source Lines | 0V | 0V | 10–15V (All) |

Figure 2A:
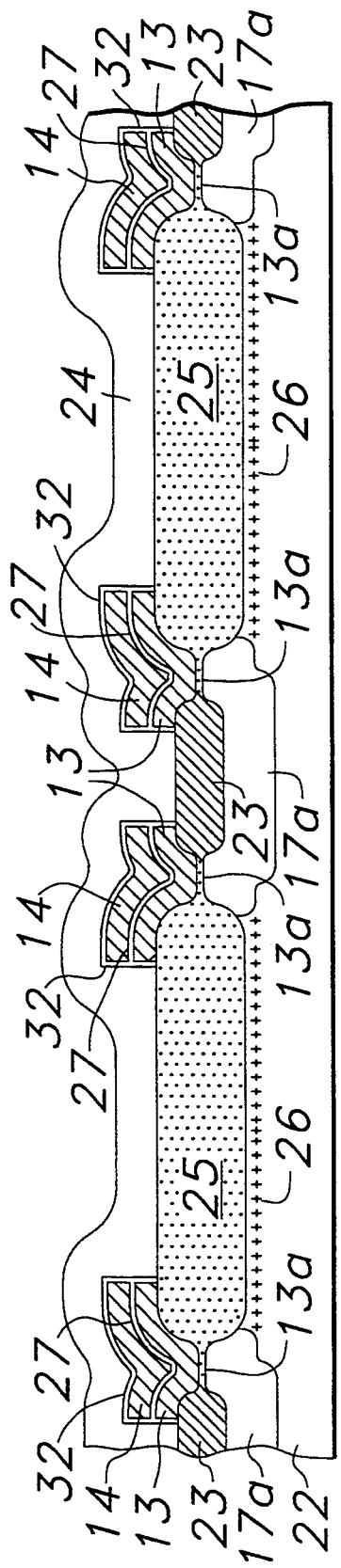
FIGS. 2a–d are elevation views of a small part of a memory cell array of this invention, taken along lines a—a, b—b, c—c and d—d of FIG. 3f.
Figure 2B:
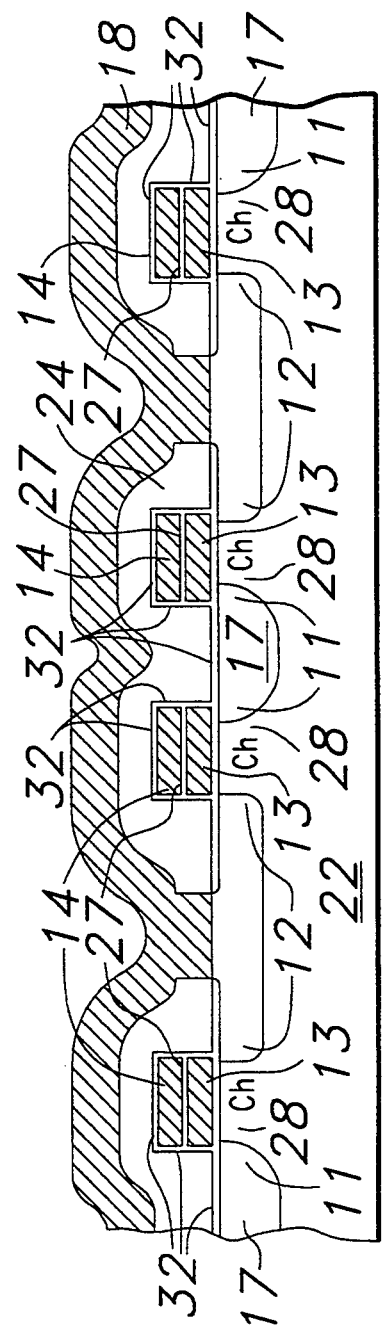
Figure 2C:
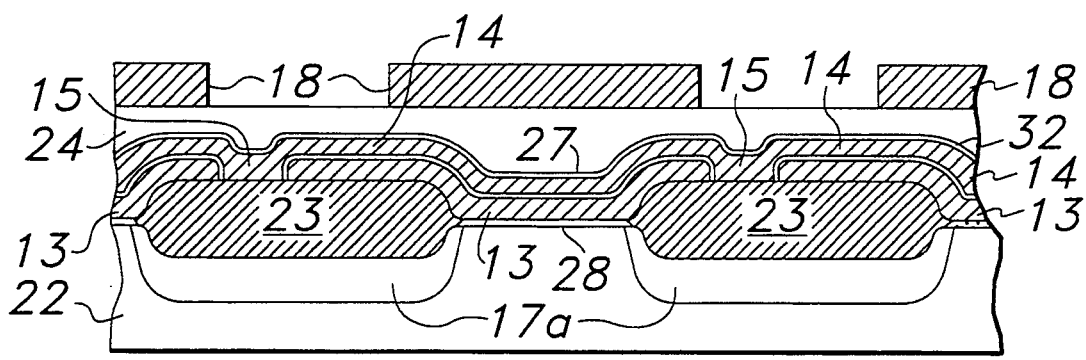
Figure 2D:
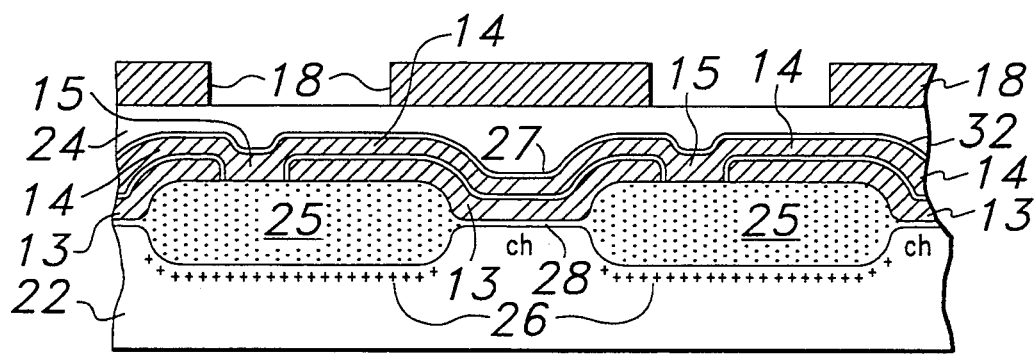
Figure 2E:
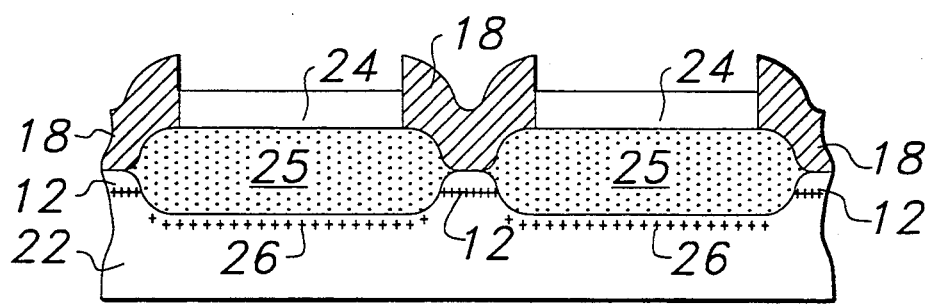

Referring now to FIGS. 2a–d and 3f, an array of electrically-erasable and programmable memory cells is formed in a face of a P-type silicon substrate 22. Multiple conductive wordlines 15, each defining a row of memory cells, are formed on the face of the substrate 22. N+ source lines 17 comprise a series connection of buried N+ regions 17a and source regions 11, the regions 17a formed by N+ regions buried under thick-insulator regions 23. The source lines 17 are contacted by a metal conductor (not shown) every 8, 16 or 32 cells to save chip area required by contacts. The drain-column lines 18, illustrated in FIGS. 2b–d, are columnar conductors separated from wordlines 15 by insulator regions 24 and are connected to drain regions 12 of columnar pairs of cells. Cell-isolation thick-field insulator columns 25 and channel isolation stop regions 26 provide isolation between adjacent source lines 17, as well as between adjacent columns of cells.

A wordline 15 includes control-gate conductors 14 for the memory cells in the wordline 15 row. Floating-gate conductors 13 extend across a memory cell 10 (aligned with a respective wordline 15/control gate 14), over the channel Ch between source 11 and drain 12 and over a tunnel-window section 13a. The wordlines 15 are actually aligned with the floating-gate conductors 13. The slight offset depicted in the FIG. 3f is for the purpose of clarity.

Figure 3A:
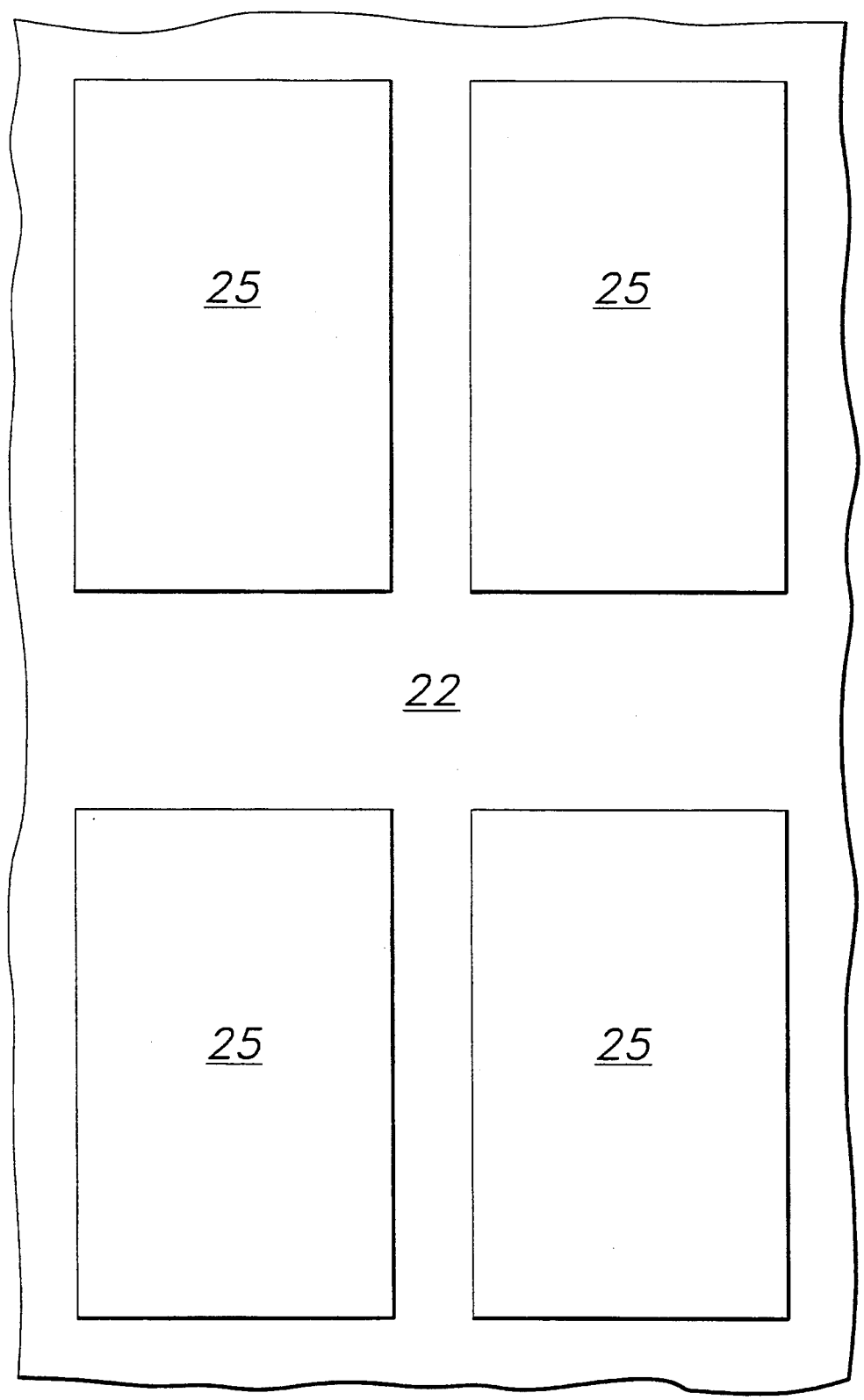
FIGS. 3a–f are enlarged plan views of a small part of a memory cell array of this invention at successive fabrication stages.
Figure 3B:
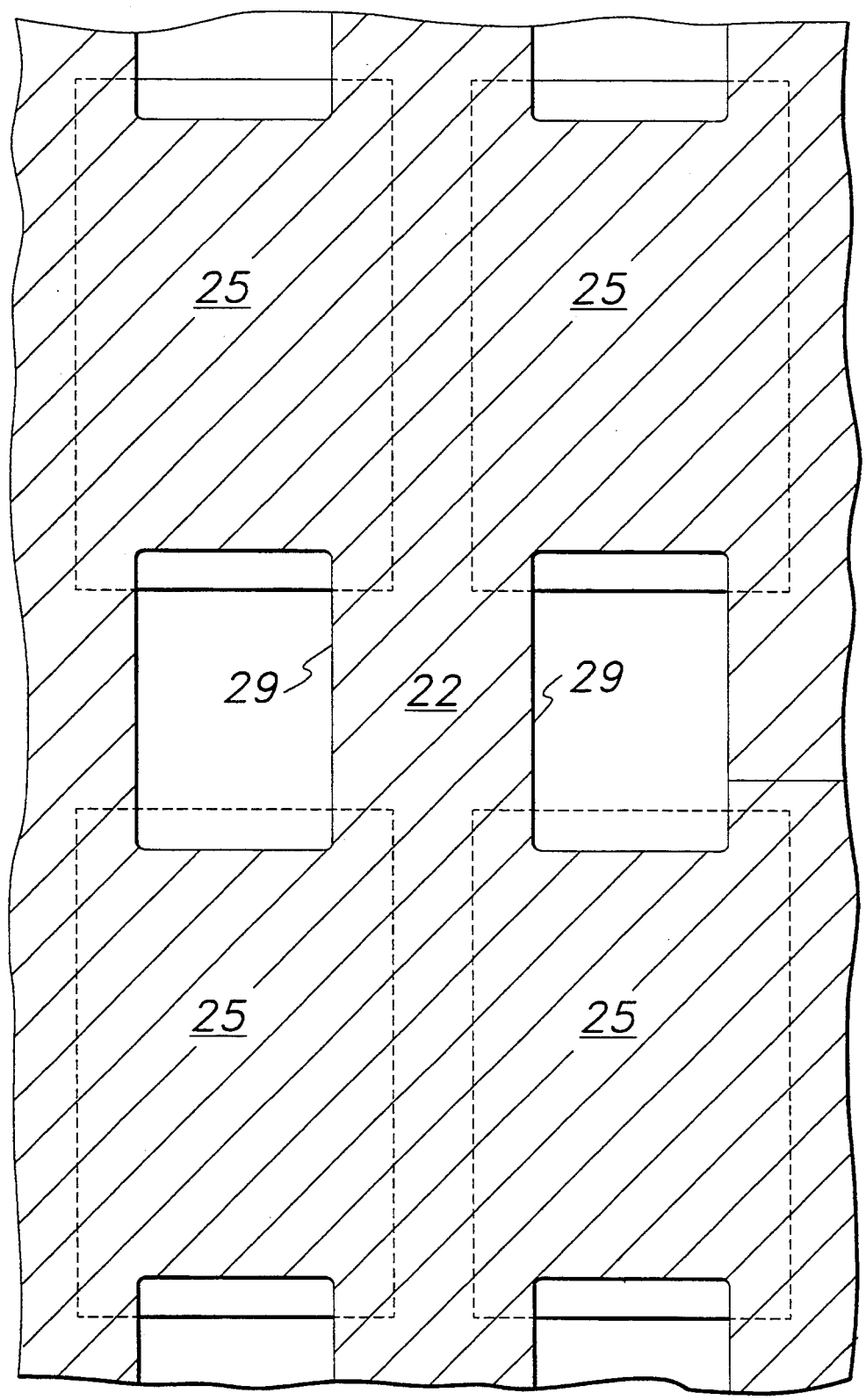
Figure 3C:
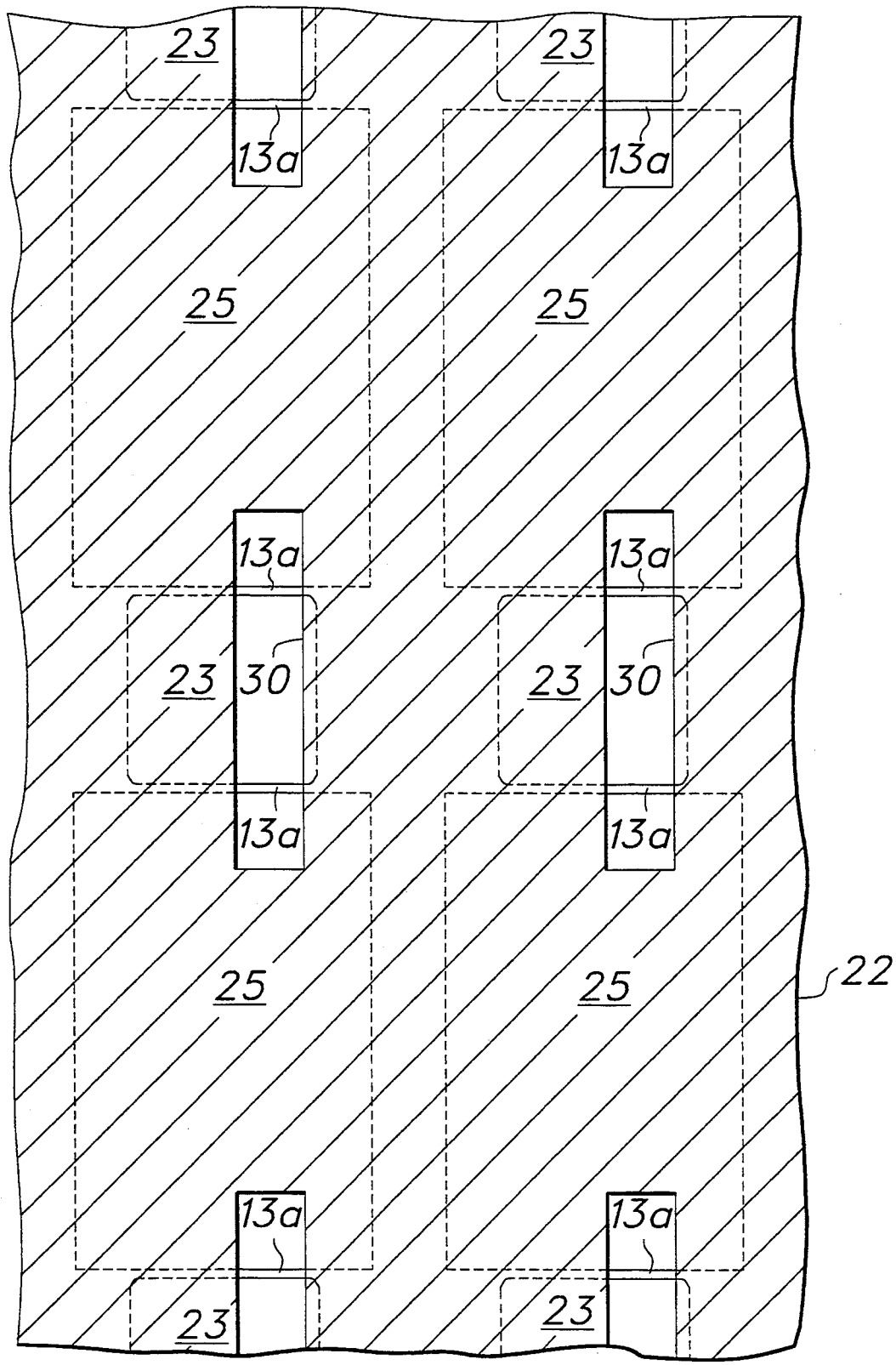
Figure 3D:
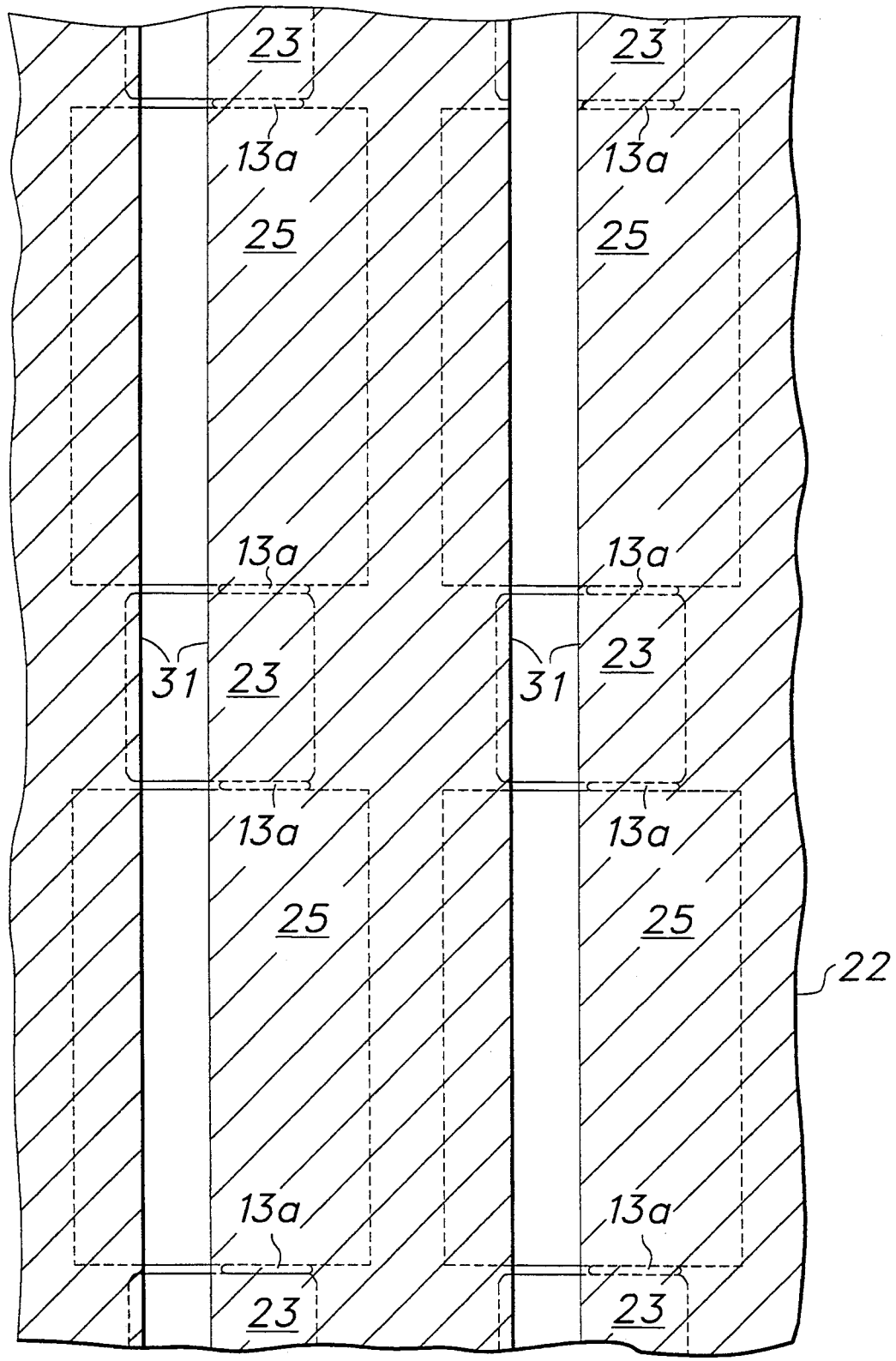
Figure 3E:
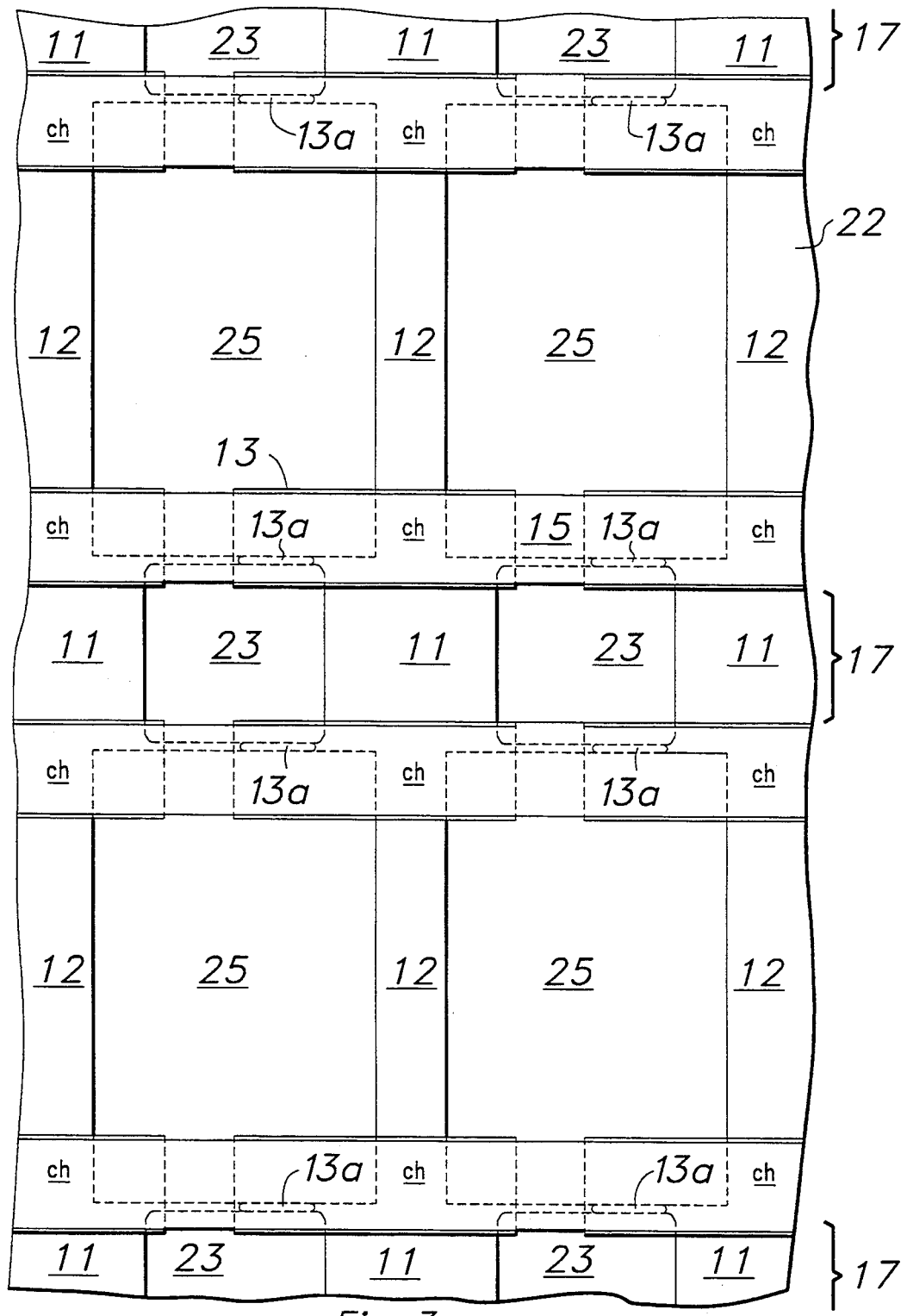
Figure 3F:
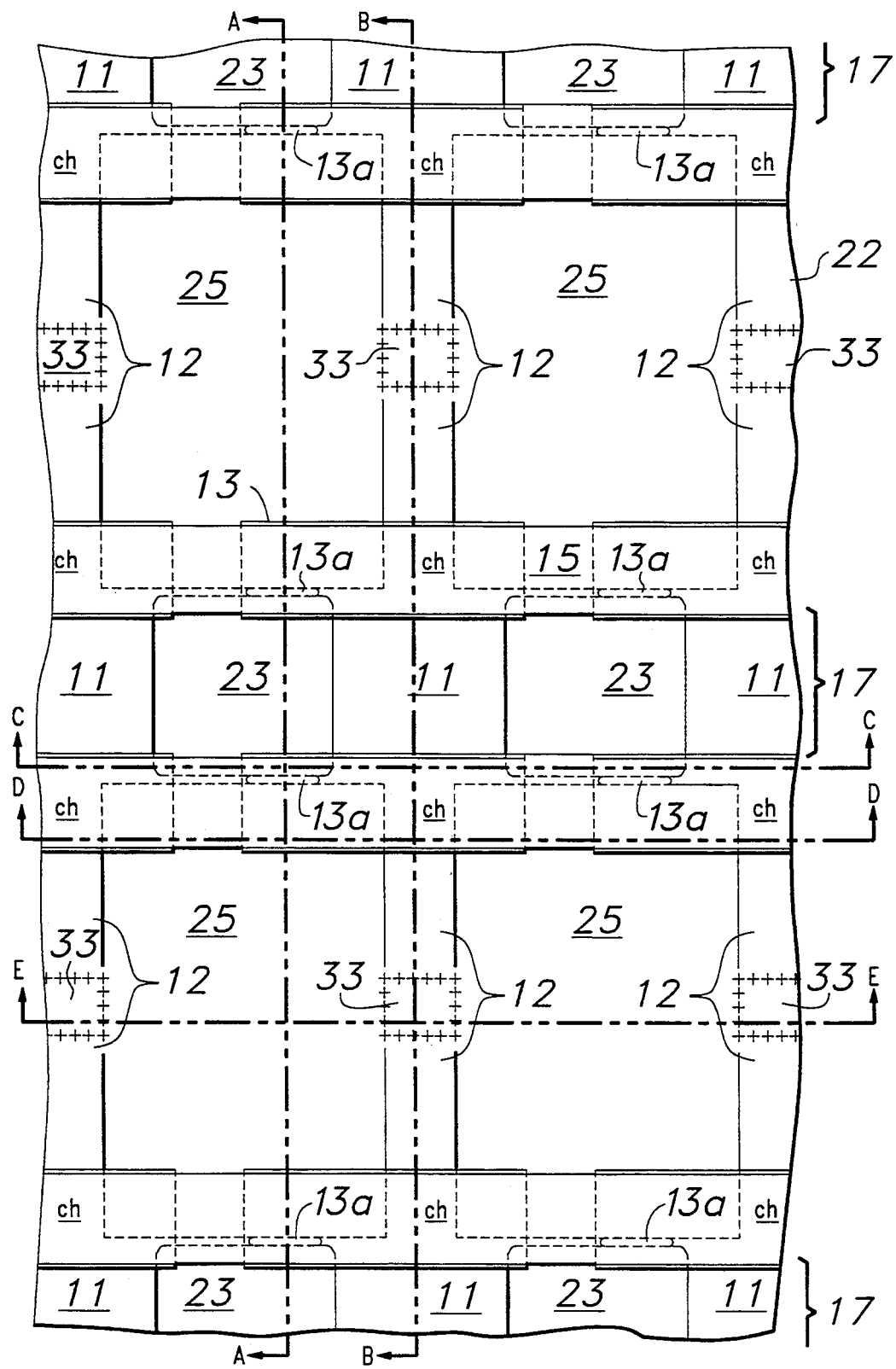

As shown in FIGS. 2b and 3f, source line 17 includes source regions 11 of cells in alternate adjacent rows. Shared drain regions 12 between alternate adjacent rows are connected to drain-column lines 18, as illustrated in FIG. 2b. As shown in FIGS. 2a and 3f, the source line 17 is separated from floating gate 13 by a tunnel-window insulator 13a.

Tunnel-window insulator 13a is self-aligned between the source-line thick-insulator regions 23 and the cell-isolation thick insulators 25, defining a Fowler-Nordheim tunnel region.

For each memory cell, wordline 15 includes a control gate conductor 14. An underlying floating-gate conductor 13 is insulated from the control gate conductor 14 by an inter-level dielectric insulator (e.g., Oxide-Nitride-Oxide) layer 27, and from the channel region Ch by the gate insulator (e.g., oxide) layer 28.

The floating-gate 13 is capacitively coupled to the channel region Ch through relatively thin gate insulator 28 (about 200–400 Angstroms of oxide), and is capacitively coupled to the source line 17 through an even thinner (about 100 Angstroms) tunnel-window insulator 13a. The capacitive coupling between the control gate 14 and the floating gate 13 is enhanced by extension of the control gate 14 and the floating gate 13 over parts of adjacent cell-isolation thick-field insulators 25 and over a part of thick-insulator region 23 burying the N+ source line 17. A prior-art example of enhancing the capacitive coupling by such extension is the structure of U.S. Pat. No. 4,422,092, entitled "High Coupling Ratio Electrically Programmable ROM", issued Dec. 23, 1983 to Daniel C. Guterman and also assigned to Texas Instruments Incorporated.

Various implant procedures can be used to tailor the junctions of the source/drain regions 11,12 for optimum programming and erasing efficiency. For programming efficiency, the drain-channel junction is tailored to exhibit an abrupt profile that facilitates hot-carrier injection. For erasing operations free of gated-diode breakdown, the source-channel junction is tailored to exhibit a sloped (graded) profile.

The memory cell pair configuration of the illustrated embodiment is not critical to the present invention, but is a matter of routine design choice. Alternative memory cell configurations may be adapted to use various aspects of this invention, including Fowler-Nordheim tunneling for erasing and channel and junction profiling to enhance avalanche-injection efficiency.

A method of fabricating the preferred embodiment of the injection-program/tunnel-erase EEPROM cell 10 pair is described with reference to FIGS. 3a–3f, which are plan views of a part of the device illustrated in FIGS. 2a–d. (FIGS. 3a–3f do not include the drain column lines 18 and insulators 24 of FIGS. 2b–d.) Conventional photo-lithographic techniques well known in the art are used. These figures, and the various layers and areas, are not drawn to any absolute or relative scale, but are for illustrative purposes only.

The starting material is a slice of P-type silicon of which the substrate 22 is only a small portion. The slice is perhaps 6 inches in diameter, while an individual member cell 10 is only a few microns wide. A number of process steps would normally be performed to create transistors peripheral to the memory array, and these will not be discussed. For example, the EEPROM memory device may be of the complementary field effect type (CMOS) having N-wells and P-wells formed in the substrate 22 as part of a prior process to create peripheral transistors.

A pad-oxide layer about 400 Angstroms thick is grown or deposited on the face of substrate 22. The pad-oxide layer protects the substrate 22 during the initial fabrication steps and will be subsequently removed. A silicon-nitride layer is then deposited over the pad-oxide layer using low pressure chemical vapor deposition. The pad-oxide and silicon-nitride layers are then patterned and plasma-etched to expose areas where rows and columns of cell-isolation thick-field insulators 25 are to be formed.

A boron implant at a dose of about $8 \times 10^{12}$ cm$^{-2}$ is performed to create a P+ channel stop region 26 that will isolate the memory cells. After removing the photoresist, the thick field oxide that forms the cell-isolation thick-field insulators 25, as illustrated in FIGS. 3a and 2a-d, is thermally grown in a localized oxidation process to a thickness of about 6000–10000 Angstroms by exposure to steam at about 900° C. and one atmosphere for several hours. Alternatively, a high pressure oxidation (HIPOX) can be used to decrease oxidation time. As is well-known, the oxide grows beneath the edges of the silicon-nitride layer, creating "bird's beak" areas instead of abrupt transitions.

Next, the remaining portions of the pad-oxide and silicon-nitride layers are removed. This procedure exposes the silicon substrate 22 between the cell-isolation thick-field insulators 25.

With reference to FIG. 3b, a photoresist mask 29 is formed over substrate 22 and cell-isolation thick-field insulators 25 are masked to expose substrate 22 between rows of insulators 25. The photoresist mask 29 is shaped and positioned to expose at least a part of the sloped edge of each thick-field insulator 25 adjacent the exposed portion of substrate 22 between rows of insulators 25, generally covering the four corners of insulators 25. The exposed portions of substrate 22 will become parts 17a of the source lines 17 of the memory array.

The next step is to implant parts 17a of the N+ source lines 17 (see FIGS. 3b and 2a-b) in the exposed areas of substrate layer 22. Substrate 22 is protected from N+ implant near what will be the source region 11 of each cell 10. An arsenic implant is performed at a dosage of about $6 \times 10^{15}$ cm$^{-2}$ at about 135 Kev to create parts 17a of N+ source lines 17 for each pair of rows of memory cells 10.

Following the N+ implant of parts 17a of source lines 17, the photoresist is removed, and the substrate 22 is annealed at about 900°–1000° C. for about 30 minutes in an annealing ambient to repair the implant damage.

Again with reference to FIG. 3c and 2a-b, a differential silicon oxidation procedure is then performed to grow thermally source-line thick-insulator regions 23, burying the corresponding parts 17a of N+ source lines 17. This thermal oxidation procedure is performed with steam at about 800°–900° C. to grow thick-insulator regions 23 to a thickness of about 1500 to 3000 Angstroms in the heavily doped regions 17 (a high pressure oxidation can also be used for this step). At the same time, a thinner oxide (in the range of 150–300 Angstroms) grows in the region between thick-insulator regions 23 and cell isolation thick-field oxide insulator 25.

At this point, with the thin oxide region between the cell-isolation insulators 25 and thick-insulator region 23, channel implants can be performed for channel optimization, using conventional techniques. For example, after appropriately patterning the substrate 22 face with photoresist (leaving the thin oxide regions exposed), one or more boron implants can be used for threshold voltage adjustment of cells 10 and for tailoring junction gradation, achieving a desired channel profile (doping and depth).

The differential oxidation process also begins formation of the tunnel windows 13a. Due to the presence of the "bird's beak" portions of the cell-isolation insulators 25, the arsenic implant of parts 17a of source lines 17 is partially masked by the bird's beak, so that the concentration of the arsenic dopant in tunnel-window 13a subregions is lower than the arsenic concentration in the rest of parts 17a of source lines 17. As a result, oxide growth in the tunnel-window 13a subregions is considerably less than the thick oxide growth over the parts 17a of source lines 17, forming a "dimple" at the interface of isolation oxide insulator 25 and thick oxide 23. The thickness of this intervening oxide is not important, since it will be etched and tunnel-window oxide regrown to a relatively precise thickness.

The next procedure is to form the Fowler-Nordheim tunnel windows. Photoresist mask 30, as illustrated in FIG. 3c, is used to protect all of the surface of substrate 22 except in the areas where tunnel windows 13a are to be formed. This photoresist step exposes the region at the interface between the cell-isolation thick-field insulator 25 and the thick-insulator region 23, i.e., above tunnel-window 13a subregions. The exposed tunnel-window 13a subregions may be implanted with phosphorus at a dosage of about $1 \times 10^{14}$ cm$^{-2}$ to $5 \times 10^{14}$ cm$^{-2}$, through the overlying oxide to create extensions or subregions of parts 17a of source lines 17.

The exposed oxide covering the tunnel-window 13a subregions is then etched down to the silicon substrate 22. This etch process also correspondingly etches the exposed portions of the source-line thick-insulator 23, and the cell-isolation thick-field insulator 25. As an alternative to the phosphorous implant, an arsenic implant can be used, followed by annealing.

The foregoing procedure for forming tunnel windows between source lines 17 and floating gates 13 is also discussed in the aforementioned U.S. patent applications Ser. No. 07/219,529 and No. 07/507,823, for example.

The photoresist mask 30 is removed after the tunnel implant/etch, and relatively thin tunnel-window 13a oxides are then grown to a thickness of about 100 Angstroms, forming the Fowler-Nordheim tunnel windows 13a. At the same time, oxide 28 between regions 25 grows to a thickness of about 200–400 Angstroms. Because of the curved (or sloped) surface of the oxide in the tunnel window 13a prior to etching, the width of the regrown tunnel-window 13a oxides is controlled by varying the length of time for the etching process. This self-aligned tunnel window and method have been discussed in the related applications listed above. This remote tunnel region is self-aligned, sublithographic and scalable.

The process of forming the floating-gate conductors is performed by depositing a layer of first-level polysilicon over the substrate 22 face. This first-level polysilicon layer is deposited to a thickness of about 1500–4000 Angstroms. The layer is highly doped N+ with phosphorous to render it conductive and is de-glazed. An insulator layer, e.g., an Oxide-Nitride-Oxide (ONO) layer, is formed over the first-level polysilicon layer.

The first-level polysilicon layer is patterned with photoresist to define insulated floating-gate strips 31, as illustrated in FIG. 3d, to define two edges of the floating gates 13. (A later stack-etch procedure is used to complete the definition of the floating-gate conductors 13.) The photoresist covering the tops of the floating-gate strips 31 is then removed.

After the floating-gate strip 31 fabrication, about 2000–5000 Angstroms of oxide is deposited, and anisotropically etched back to create sidewall oxides at the edges of the floating-gate strips 31. Next, an inter-level insulator layer 27 such as oxide/nitride/oxide (ONO) of equivalent oxide (dielectric) thickness in the range of 200–400 Angstroms is formed over the substrate 22 memory array by conventional techniques.

A second-level polysilicon layer 2000–4500 Angstroms thick is then deposited over the face of the substrate 22, highly doped N+ (and/or optionally subjected to a silicide deposit and treatment) to make it conductive, then de-glazed. Next, a stack-etch procedure is used to create the wordlines 15 that correspond to rows of memory cells 10. Photoresist (not shown) is applied to define wordline 15 stacks that include the second-level polysilicon layer, the inter-level insulator layer 27, and the first-level layer that forms columnar floating-gate strips 31. As illustrated in FIG. 3e, the stack etch defines a plurality of elongated wordlines 15 running substantially parallel to the source lines 17, defining the floating gates 13, and in particular the channels Ch between what will be the sources 11 and drains 12.

Thus, the stack etch produces wordline conductors 15 that are continuous in the wordline 15 direction and produces a control gate 14 for each memory cell 10 in each wordline 15 row. The control gate 14 is capacitively coupled to respective underlying floating gates 13 through the corresponding portion of the inter-level insulator 27.

Provided that proper distances and alignment have been maintained in the previous steps, the stack-etched first- and second-level polysilicon layers are used in later fabrication steps as an implant mask to establish the length of the channel regions Ch between sources 11 and drains 12. In this manner, the channel junctions can be tailored for optimum efficiency of hot-carrier injection from the channel region to the floating gate 13. The buried N+ source line 17 should be spaced a sufficient distance from the region between cell isolation insulators 25 that the channel length is determined solely by the stack etch.

With reference to FIG. 3f, the next step is to implant, on either side of each channel-section Ch, the shared N+ drains 12 and the N+ source regions 11 that complete source lines 17. The stack etched first- and second-level polysilicon strips form an implant mask covering the channel regions Ch between sources 11 and drains 12. An arsenic implant is performed at a dosage of about $6 \times 10^{15}$ cm$^{-2}$ at about 135 Kev to create the self-aligned N+ drain regions 12 and source regions 11 for each memory-cell 10.

At each channel region Ch, the junctions of the N+ drain regions 12 and the N+ source regions 11 are self-aligned with the corresponding edges of the overlying channel sections of floating gates 13 and control gates 14 formed by the stack-etch step. After the arsenic implant, a phosphorous implant of a suitable energy may be used in the source regions 11 (after covering the drain regions 12 with photoresist), to tailor the source-channel junction for a more sloped junction profile. Using a source-channel junction tailoring implant yields optimum junction profiles by providing a relatively sloped source-channel junction for improving the source-channel junction breakdown voltage, without affecting the relatively abrupt drain-channel junction used for programming. The drain 12 junction profiles can be maintained throughout the remainder of the fabrication process by carefully controlling subsequent heat treatment cycles to minimize further drive.

Following the implant of drain regions 12 and the source regions 11, the substrate 22 is annealed at about 900°–1000° C. in an annealing ambient to repair the implant damage and to provide junction drive.

The N+ implant-drive associated with forming the N+ regions in the implant step results in some diffusion of the arsenic dopant under the corresponding edges of the masking channel sections of the control gates 14 and floating gates 13. By controlling the N+ implant-drive, the diffusion of the arsenic dopant into the channel regions Ch can be minimized, and these drain junctions maintained in fairly abrupt alignment with the corresponding edges of the masking channel-sections of the gates 13 and 14.

An oxide layer 32 is grown over substrate 22, including over wordlines 15, drain regions 12 and source regions 11. Oxide layer 32 enhances data retention. With reference to FIGS. 2a–d, a borophosphosilicate (BPSG) glass layer 24 is then deposited. The BPSG layer 24 is etched to form holes 33 (FIG. 3f) which extend through the BPSG layer 24 to drain regions 12. At the same time, holes may be formed for off-array contacts. Contact holes 33 may be formed with minimum distance to the field oxide insulators 25, followed by a phosphorous or phosphorous-like implant and implant-anneal for contacts that are self-aligned to the field oxide insulators 25. A metal layer is formed over the substrate and etched to form metal drain-column lines 18 connecting paired drain regions 12. The metal bitlines are formed on the BPSG layer to run over and perpendicular to the wordlines 15 and the buried source lines 17.

The injection-program/tunnel-erase EEPROM cell 10 of this invention provides an EEPROM memory cell 10 that is electrically programmable using hot-carrier injection (channel-hot electrons and avalanche-breakdown electrons), and is electrically erasable using Fowler-Nordheim tunneling. The invention takes advantage of the lower programming voltages required for hot-carrier injection, while avoiding disadvantageous channel-oxide damage caused by hot-carrier erasure.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A method of fabricating a nonvolatile memory cell at tile face c,f a semiconductor substrate of a first conductivity-type, comprising:
   creating at least two cell-isolation field insulator regions in said substrate, each said field insulator regions having at least one vertical edge with said vertical edges separated on said substrate by a channel-drain area, and each said field insulator region having a horizontal edge;
   creating a source-line segment adjacent each said horizontal edge to each said field insulator region by selectively implanting a dopant of a second conductivity-type opposite said first conductivity-type in said substrate;

forming a line insulator over said each source-line segment;

forming a tunnel-window insulator at a junction between one of said line insulators and said field insulator regions;

forming a first conductive layer and an underlying gate insulator layer over said face of said substrate, including said field insulators and said line insulator;

forming an inter-level insulator layer over said first conductive layer;

selectively etching said second conductive layer and said inter-level insulator layer to define a floating-gate strip at least over said channel-drain area and said tunnel-window insulator;

forming a second conductive layer over said substrate, including said floating-gate strip;

stack etching said second conductive layer, said inter-level insulator layer and said first conductive layer, to define a control gate and a floating gate, said control gate and said floating gate each including a channel-section over at least a part of said channel-drain area, said floating gate including a tunnel-window section over said tunnel-window insulator; and using said control gate as an implant mask, selectively implanting a dopant of a said second conductivity-type to create a source region and to create a drain region in areas of said substrate not covered by said field insulators and line insulators.

2. The method of claim 1, wherein a single dopant is used in the step of implanting a dopant to create said drain region.

3. The method of claim 1, including the step of selectively implanting in said substrate a dopant of said first conductivity-type tier adjusting the threshold voltage of said memory cell.

4. The method of claim 1, including the step of selectively implanting in said source region a second dopant of said second conductivity-type to create a graded doping profile for the junction between said source region and said substrate under said channel-section.

5. The method of claim 1, wherein said gate insulator layer is thicker than said tunnel window insulator.

6. The method of claim 1, wherein said inter-level insulator layer is formed by a three-insulator oxide-nitride-oxide layer.

7. A method of fabricating a nonvolatile memory cell array at the face of a semiconductor layer having a first conductivity-type, comprising:

forming rows and columns of cell-isolation field insulator regions each said field insulator having a pair, or row, edges and a pair of column edges, each of said column edges separated on said substrate by a channel-drain area;

implanting a dopant of a second conductivity-type opposite said first conductivity-type to create source-line segments in said substrate, said source-line segments extending from a row edge of one said field insulator region to a row edge of an adjacent field insulator region;

forming line insulators over said source-line segments;

forming tunnel-window insulators at the junction of each said field insulator region and each said line insulator;

forming floating-gate strips from a deposited conductive layer, said floating gate strips at least over said channel-drain area and over said tunnel-window insulators, said floating-gate strips insulated from said substrate by gate-insulator layers and having inter-level insulator layers over said floating-gate strips;

forming control gates and wordlines from a deposited conductive layer over said inter-level insulator layers and, at the same time, forming floating gates from said floating gate strips, each said control gate and each said floating gate extending over at least a part of a said channel-drain area and extending over a said tunnel-window insulator;

using said control gates as masks, implanting a dopant of a said second conductivity type opposite said first type to create source regions and to create drain regions in areas of said substrate other than said field insulator regions and line insulators; and forming drain lines connecting columns of said drain regions.

8. The method of claim 7, wherein a single dopant is used in the step of implanting a dopant to create said drain regions.

9. The method of claim 7, including the step of implanting dopant through said tunnel-window insulators into extended regions of said source-line segments.

10. The method of claim 7, wherein said inter-level insulator layers are formed as three-insulator oxide-nitride-oxide layers.

* * * * *